(12) United States Patent
Lee

(10) Patent No.: US 6,815,990 B2
(45) Date of Patent: Nov. 9, 2004

(54) DELAY LOCKED LOOPS HAVING BLOCKING CIRCUITS THEREIN THAT ENHANCE PHASE JITTER IMMUNITY AND METHODS OF OPERATING SAME

(75) Inventor: Jong-soo Lee, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/422,322

(22) Filed: Apr. 24, 2003

(65) Prior Publication Data

US 2004/0135604 A1 Jul. 15, 2004

(30) Foreign Application Priority Data

Jan. 10, 2003 (KR) .......................................... 2003-1593

(51) Int. Cl.[7] .............................................. H03L 7/06
(52) U.S. Cl. ..................... 327/158; 327/161; 375/376
(58) Field of Search ..................... 327/144, 153–159, 327/161, 231, 233; 375/371–376; 331/DIG. 2; 365/233

(56) References Cited

U.S. PATENT DOCUMENTS

| | | | |
|---|---|---|---|
| 5,614,855 A | 3/1997 | Lee et al. | 327/158 |
| 5,926,515 A | 7/1999 | Park | 375/376 |
| 6,087,868 A * | 7/2000 | Millar | 327/156 |
| 6,133,783 A | 10/2000 | Stockman et al. | 327/554 |
| 6,226,339 B1 | 5/2001 | Nam et al. | 375/376 |
| 6,229,368 B1 | 5/2001 | Lee | 327/292 |
| 6,373,913 B1 | 4/2002 | Lee | 375/376 |
| 6,388,485 B2 | 5/2002 | Kim | 327/161 |
| 6,400,643 B1 * | 6/2002 | Setogawa | 365/233 |
| 6,404,248 B1 * | 6/2002 | Yoneda | 327/158 |
| 6,424,193 B1 | 7/2002 | Hwang | 327/158 |
| 6,430,244 B1 | 8/2002 | Ryu | 375/376 |
| 6,434,083 B2 | 8/2002 | Lim | 365/233 |
| 6,434,206 B1 | 8/2002 | Yu | 375/376 |
| 6,452,432 B2 | 9/2002 | Kim | 327/158 |
| 6,486,651 B1 | 11/2002 | Lee et al. | 324/76.53 |
| 6,496,554 B1 | 12/2002 | Ahn | 375/376 |
| 6,628,154 B2 * | 9/2003 | Fiscus | 327/158 |

OTHER PUBLICATIONS

Rabaey, Jan M., "Digital Integrated Circuits, A Design Perspective," 1996 by Prentice–Hall, Inc., pp. 540–543.
"DDR SDRAM Functionality and Controller Read Data Capture," Design Line, 3rd Quarter, vol. 8, Issue 3, 1999.

* cited by examiner

Primary Examiner—Minh Nguyen
(74) Attorney, Agent, or Firm—Myers Bigel Sibley & Sajovec

(57) ABSTRACT

DLL integrated circuits include least one delay element associated with the generation of an internal clock signal and a control circuit that is configured to periodically adjust a delay of said at least one delay element in response to a first clock signal (CLK). The control circuit is further configured to block at least one periodic adjustment of the delay of the at least one delay element in response to detecting excessive jitter with CLK. This DLL may be configured to block at least one periodic adjustment to a phase of an internal clock signal (ICLK) in response to detecting an excessive phase difference between the first clock signal (CLK) and a feedback clock signal (FCLK) derived from the internal clock signal (ICLK).

17 Claims, 9 Drawing Sheets

DELAY LOCKED LOOPS HAVING BLOCKING CIRCUITS THEREIN THAT ENHANCE PHASE JITTER IMMUNITY AND METHODS OF OPERATING SAME

REFERENCE TO PRIORITY APPLICATION

This application claims priority to Korean Application Serial No. 2003-1593, filed Jan. 10, 2003, the disclosure of which is hereby incorporated herein by reference.

FIELD OF THE INVENTION

The present invention relates to integrated circuit devices and, more particularly, to integrated circuit devices having clock generation circuits therein.

BACKGROUND OF THE INVENTION

Integrated circuit devices frequently utilize internal clock generators to synchronize the timing of internal operations within the devices. In many applications, an internal clock generator utilizes a delay locked loop (or phase locked loop) that operates to synchronize an internal clock signal to a clock signal received from external the device (i.e., an external clock signal). In FIG. 1, a conventional delay locked loop (DLL) integrated circuit 10 is illustrated. This DLL integrated circuit 10 may be utilized within many devices requiring synchronous operation, including memory devices such as synchronous dynamic random access memory (SDRAM) devices.

The DLL integrated circuit 10 of FIG. 1 includes a phase detector 14, a DLL control block 16, a DLL analog block 18 and a compensation delay unit 12. As illustrated, the phase detector 14 is responsive to a primary clock signal (CLK), which may be an external clock signal, and a feedback clock signal (FCLK). The phase detector 14 is configured to generate an up/down control signal (UP/DN) in response to detecting a positive or negative phase difference between the primary clock signal CLK and the feedback clock signal FCLK. The up/down control signal UP/DN may be a multi-bit digital signal, as shown, or an analog signal. The DLL control block 16 is illustrated as being responsive to the up/down control signal UP/DN and a driving clock signal (DCLK), which may have the same period as the primary clock signal CLK and may even be derived from the primary clock signal using on-chip circuitry (not shown) that is associated with the DLL integrated circuit 10. The DLL control block 16 is illustrated as generating a multi-bit digital control signal (CON) in response to the driving clock signal DCLK and the up/down control signal UP/DN. As will be understood by those skilled in the art, the control signal CON may be synchronized to the driving clock signal DCLK and may have a binary value that increases in response to a positive (negative) up/down control signal UP/DN and decreases in response to a negative (positive) up/down control signal UP/DN. Because the control signal CON is synchronized to the driving clock signal DCLK, the frequency of the driving clock signal DCLK typically sets the frequency at which the control signal CON is updated with a new value.

The DLL analog block 18 may comprise a conventional delay line having a variable length that is set by the value of the control signal CON. Alternatively, the delay line may have a fixed length and the control signal CON may operate to adjust the delay of each delay element in the chain. This delay line is configured to generate the internal clock signal (ICLK) in response the primary clock signal CLK, which is received at an input of the delay line. A compensation delay unit 12, which may include a fixed length delay line, is provided in a feedback path of the DLL integrated circuit 10. As illustrated, the compensation delay unit 12 generates the feedback clock signal FCLK in response to the internal clock signal ICLK. Accordingly, changes in the phase of the internal clock signal ICLK may be reflected as equivalent changes in the phase of the feedback clock signal FCLK. The compensation delay unit 12 may not be provided in some conventional DLL integrated circuits.

Unfortunately, if the feedback clock signal FCLK or primary clock signal CLK experience excessive phase jitter as a result of noise or other transient disturbance, this excessive phase jitter may manifest itself as a significant change in the value of the up/down control signal UP/DN and a significant change in the value of the control signal CON. Such large changes in the value of these control signals may significantly influence the phase of the internal clock signal ICLK and may cause timing errors within the integrated circuit device by reducing the timing budgets associated with the operation of synchronous device elements.

There are many known factors that may cause excessive phase jitter in a clock signal. For example, FIG. 2 illustrates how certain active, read and/or write commands within an integrated circuit memory device may cause abrupt power supply fluctuations (i.e., power supply noise). Such power supply fluctuations may operate to vary the effective delay provided by the compensation delay unit 12 and/or DLL analog block 18 illustrated by FIG. 1. These delay changes may result in large "transient" phase differences between the primary clock signal CLK (e.g., external clock signal) and the feedback clock signal FCLK. FIG. 3 illustrates another example of how excessive phase jitter may occur. In particular, FIG. 3 illustrates a system board 20 having a memory controller 22 that generates a synchronizing clock signal CLK and a memory device 24 (e.g., SDRAM) that receives the clock signal CLK and synchronizes internal operations to the received clock signal CLK. As illustrated, when operating at high frequency, the memory controller 22 may generate a clock signal CLK that is susceptible to abrupt jitter when passing from the output pins of the memory controller 22 to the input pins of the memory device 24. Accordingly, in response to this abrupt jitter, the phase detector 14 illustrated by FIG. 1 may generate an excessively large change in the value of the up/down control signal UP/DN, even though the abrupt jitter represents only a short duration transient to a normal operating condition where the primary clock signal CLK and feedback clock signal FCLK are otherwise locked in phase with each other.

Attempts have been made to address phase jitter errors in DLL and PLL integrated circuits. For example, U.S. Pat. No. 6,133,783 to Stockman et al. describes a phase jitter canceller that improves the operation of a PLL integrated circuit. U.S. Pat. No. 6,434,083 to Lim describes a DLL integrated circuit that generates a complementary pair of feedback clock signals to support high speed operation. The disclosures of the '783 and '083 patents, which are assigned to the present assignee, are hereby incorporated herein by reference.

Notwithstanding the above-described attempts to develop high performance DLL and PLL integrated circuit devices, there continues to be a need for improved delay locked loop DLL (and PLL) integrated circuits having less susceptibility to phase jitter.

SUMMARY OF THE INVENTION

Embodiments of the present invention operate to prevent excessive phase jitter associated with a clock signal or other periodic control signal from adversely influencing the operation of circuit elements that are controlled by the clock signal or other periodic control signal. According to one embodiment of the present invention, an integrated circuit device is provided that includes at least one delay element and a control circuit that is configured to periodically adjust a delay of said at least one delay element in response to a first clock signal (CLK). This first clock signal may be a primary clock signal, such as an external clock signal received by the integrated circuit device. The control circuit is further configured to block at least one periodic adjustment of the delay of the at least one delay element in response to detecting excessive jitter with the first clock signal (CLK). In this embodiment, the at least one delay element and the control circuit may collectively define a delay locked loop (DLL). This DLL may be configured to block at least one periodic adjustment to a phase of an internal clock signal (ICLK) in response to detecting an excessive phase difference between the first clock signal (CLK) and a feedback clock signal (FCLK) derived from the internal clock signal (ICLK). In particular, this periodic adjustment may be blocked by halting at least one periodic adjustment to the phase of the internal clock signal (ICLK) that is triggered in response to a leading edge of a driving clock signal (DCLK). This driving clock signal (DCLK) may have the same period as the first clock signal (CLK) and may even be derived from the first clock signal (CLK). The control circuit may also be configured so that in the absence of the excessive phase difference, the delay of the at least one delay element is adjusted at a frequency equal to a frequency of the driving clock signal (DCLK).

According to another embodiment of the present invention, the at least one delay element and the control circuit collectively define a percent-of-clock delay circuit (e.g., 20%-of-clock) that can be configured using master and slave delay lines. In this embodiment, the slave delay line may be configured to receive a periodic signal that is to be delayed in time by an amount equal to some percentage of a primary clock signal. Alternatively, the slave delay line may be configured to receive the primary clock signal and provide a percent-of-clock delay to the primary clock signal.

In still further embodiments of the present invention, a delay locked loop (DLL) is configured to block at least one periodic adjustment to a phase of an internal clock signal in response to detecting an excessive phase difference between an incoming clock signal and a feedback clock signal derived from the internal clock signal. Moreover, in response to an excessive phase difference that is sustained, the DLL is configured to resume periodic adjustment to the phase of the internal clock signal until the phase difference between the incoming clock signal and the feedback clock signal returns to an acceptable level.

In yet other embodiments of the present invention, a delay locked loop (DLL) is configured to generate an outgoing clock signal in response to an incoming clock signal. The DLL includes a phase detector that is configured to compare a phase of the incoming clock signal with a phase of a feedback clock signal that is derived from the outgoing clock signal. The DLL also includes a variable delay element (e.g., variable delay line) that is configured to generate the outgoing clock signal in response to at least a first time-varying control signal (e.g., multi-bit control signal) and the incoming clock signal. Here, the DLL also includes a control circuit, which operates as means, responsive to the incoming clock signal and the feedback clock signal, for generating an active halt signal that blocks at least one periodic update of a delay provided by the variable delay element in response to detecting an excessive phase difference between the incoming and feedback clock signals.

DESCRIPTION OF PREFERRED EMBODIMENTS

Figure 1:
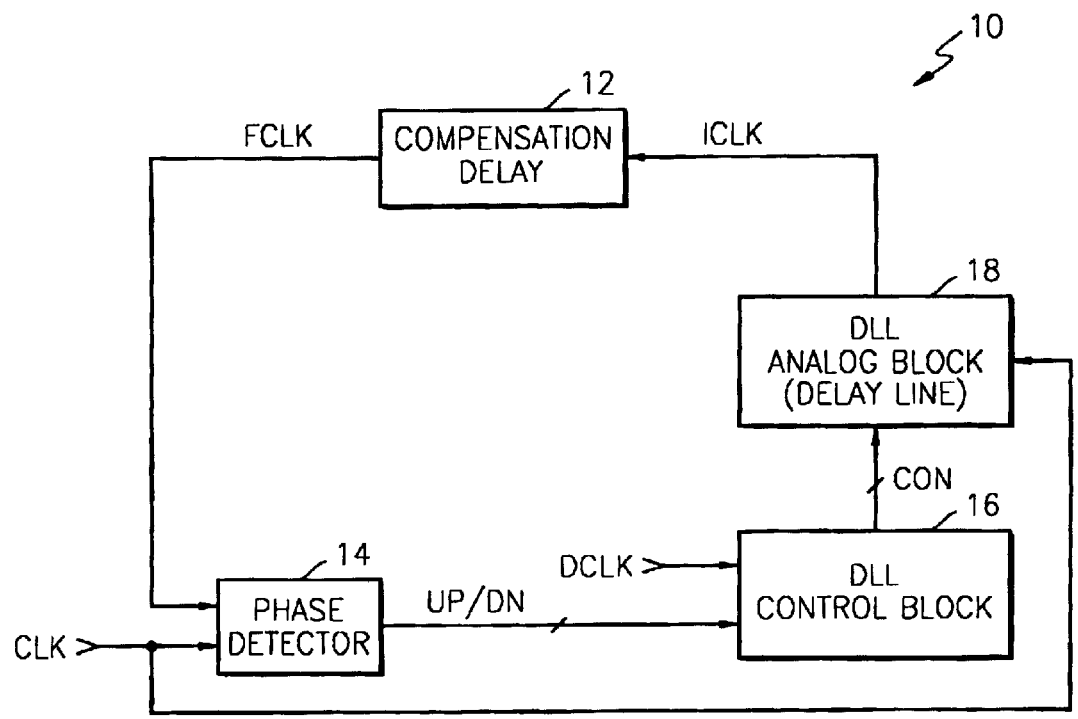
FIG. 1 is a block diagram of a delay locked loop (DLL) integrated circuit device according to the prior art.
Figure 2:
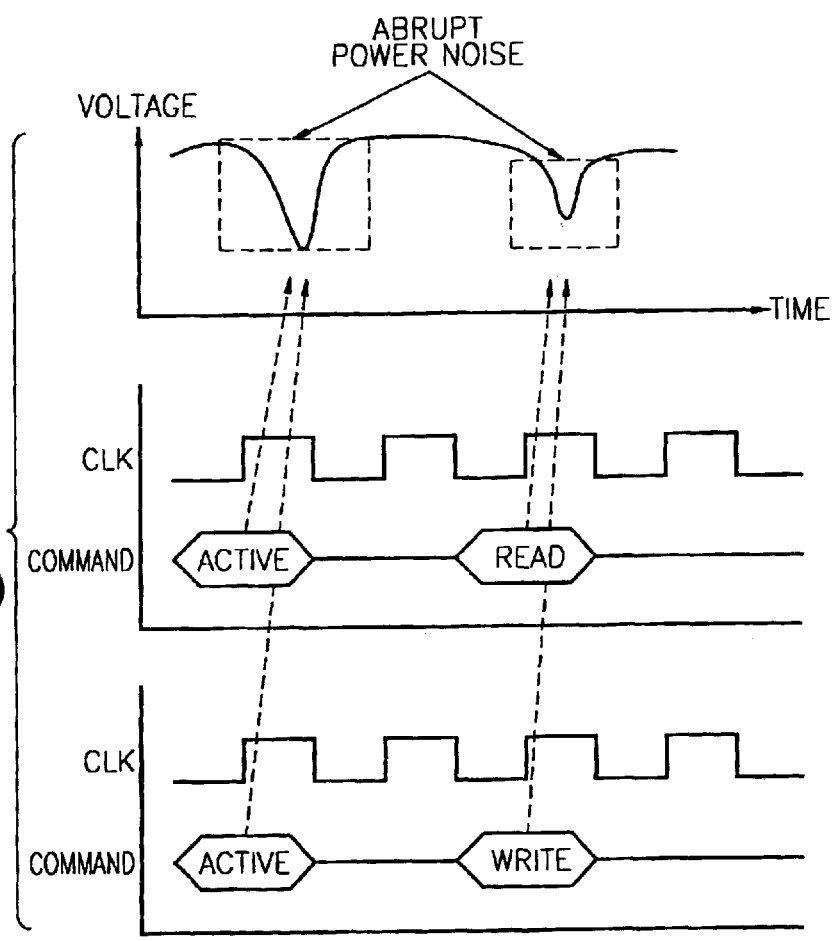
FIG. 2 is a plurality of timing diagrams that illustrate how conventional memory commands (e.g., active, read and write) can trigger abrupt power supply noise.
Figure 3:
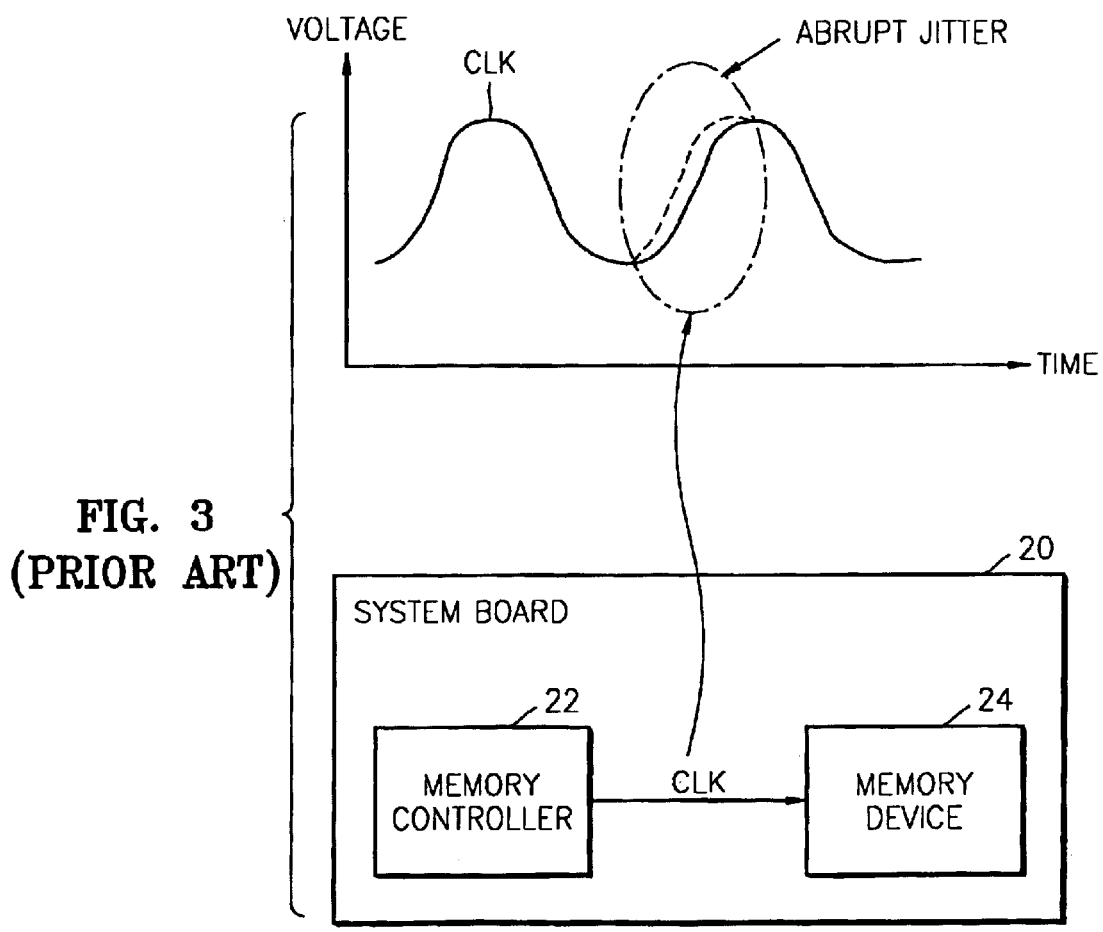
FIG. 3 is a timing diagram and block diagram of a memory system that may generate abrupt jitter associated with a clock signal.

The present invention now will be described more fully herein with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout and signal lines and signals thereon may be referred to by the same reference characters. Signals may also be synchronized and/or undergo minor boolean operations (e.g., inversion) without being considered different signals. The suffix B (or prefix symbol "/") to a signal name may also denote a complementary data or information signal or an active low control signal, for example.

Figure 4:
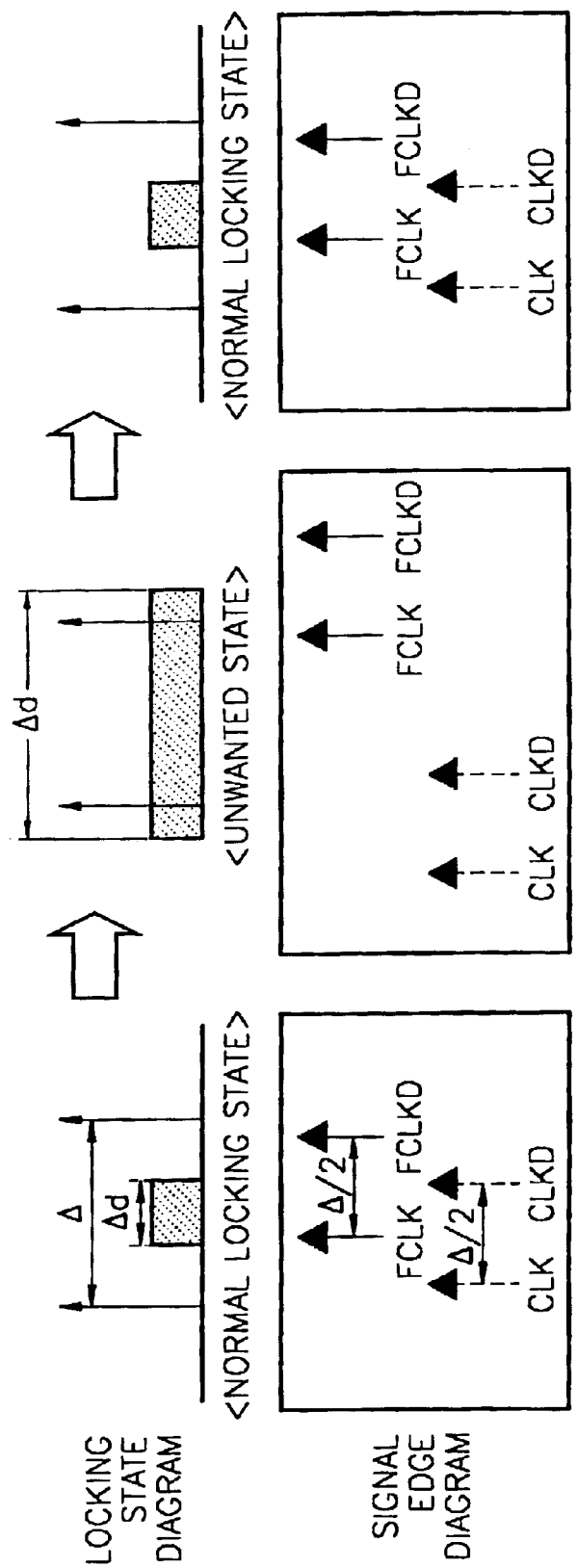
FIG. 4 illustrates locking state and signal edge diagrams associated with a sequence of clock cycles whereby a normal locking state of a DLL integrated circuit is temporarily interrupted by the presence of an excessive phase jitter between a primary clock signal (CLK) and a feedback clock signal (FCLK).

Referring now to FIG. 4, three pairs of locking state and signal edge diagrams will be described. These diagrams illustrate the operation of a delay locked loop (DLL) integrated circuit during a sequence of three consecutive cycles of a primary clock signal (CLK), which may be an external clock signal that is received by the DLL integrated circuit. On the left side of FIG. 4, a normal locking state condition is illustrated. In this normal locking state, a difference in phase between a feedback clock signal (FCLK) and the primary clock signal CLK is illustrated as "Δd", which is well within an acceptable phase difference of "Δ". As described more fully hereinbelow with respect to FIG. 7, a determination of whether the phase difference between the feedback clock signal FCLK and the primary clock signal CLK is within an acceptable range of "Δ" can be made by evaluating the leading edges of the primary clock signal CLK, a delayed primary clock signal CLKD, a feedback clock signal FCLK and a delayed feedback clock signal FCLKD. As further illustrated by the signal edge diagram on the left side of FIG. 4, the primary clock signal CLK and the delayed primary clock signal CLKD are out of phase by an amount equal to "½Δ" and the feedback clock signal FCLK and the delayed feedback clock signal FCLKD are also out of phase by an amount equal to "½Δ".

In the center of FIG. 4, an unwanted "unlocked" state is illustrated. In this unwanted state, which may result from excessive phase jitter, the phase difference between the feedback clock signal FCLK and the primary clock signal CLK is outside the acceptable range of "Δ". However, as illustrated by the right side of FIG. 4, if this excessive phase jitter represents a short duration transient, then the DLL integrated circuit resumes a normal locking state in the next clock cycle. As will now be explained more fully hereinbelow, this immediate resumption of a normal locking state can be advantageously achieved without altering the operating characteristics of a DLL integrated circuit by adjusting the phase of the feedback clock signal FCLK. In other words, the excessive clock jitter that is represented by the locking state and signal edge diagrams at the center of FIG. 4 can be ignored by a DLL integrated circuit if the jitter constitutes a sufficiently short duration transient.

Figure 5A:
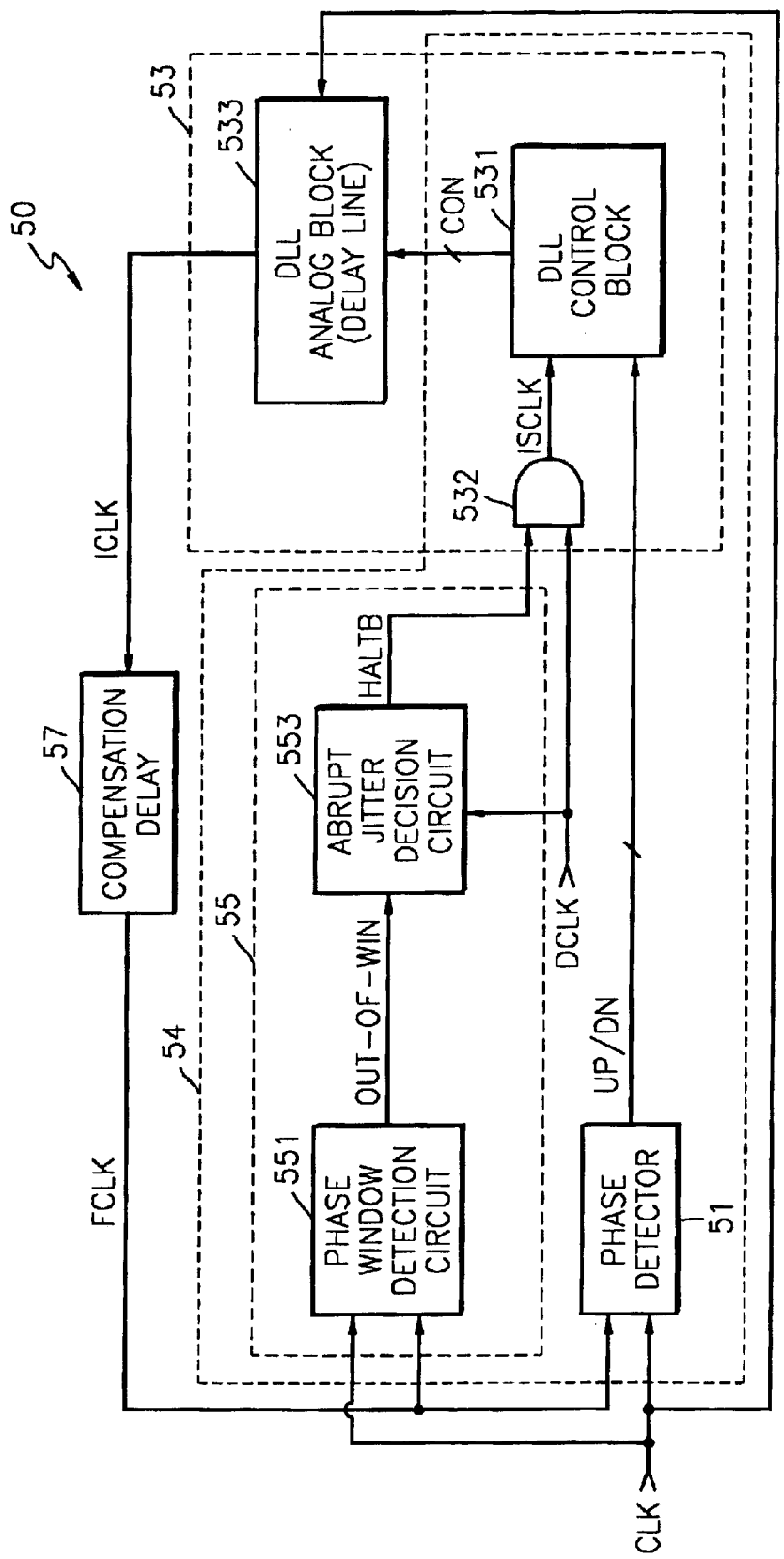
FIG. 5A is a DLL integrated circuit according to one embodiment of the present invention.
Figure 5B:
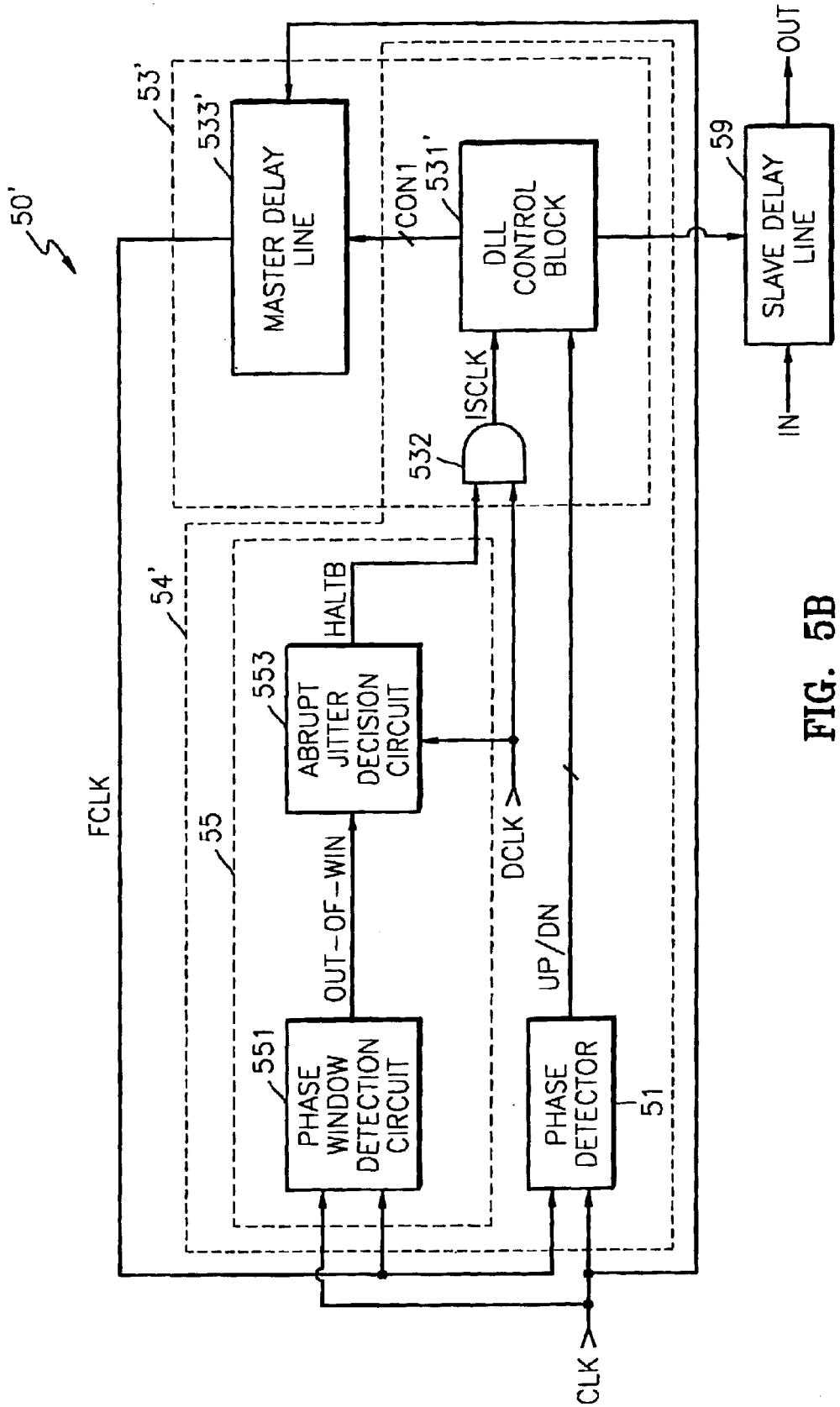
FIG. 5B is a DLL integrated circuit according to another embodiment of the present invention.

DLL integrated circuits that are capable of ignoring excessive clock jitter of the short duration type illustrated by FIG. 4 will now be described more fully with respect to FIGS. 5A–5B. In particular, FIG. 5A illustrates a DLL integrated circuit 50 that is configured to generate an internal clock signal (ICLK) in response to a primary clock signal (CLK). This primary clock signal CLK may be an external clock signal that is received by an integrated circuit chip containing the DLL integrated circuit 50. The DLL integrated circuit 50 includes a phase detector 51, an internal clock generating circuit 53 and an abrupt jitter detection and blocking circuit 55. In some embodiments, a compensation delay unit 57 may also be provided to add a fixed delay to the internal clock signal ICLK. In other embodiments, the compensation delay unit 57 may not be necessary.

The phase detector 51 is responsive to the primary clock signal (CLK) and a feedback clock signal (FCLK). The phase detector 51 is configured to generate an up/down control signal (UP/DN) in response to detecting a positive or negative phase difference between the primary clock signal CLK and the feedback clock signal FCLK. The up/down control signal UP/DN may be a multi-bit digital signal, as shown, or an analog signal. The internal clock generating circuit 53 is illustrated as including a DLL analog block 533 and a DLL control block 531. The phase detector 51, the abrupt jitter detection and blocking circuit 55 and the DLL control block 531 collectively form a DLL control circuit 54 that is configured to perform the operations of these elements of the DLL integrated circuit 50.

The DLL control block 531 is illustrated as generating a multi-bit digital control signal (CON) in response to an internal system clock signal (ISCLK) and the up/down control signal UP/DN. Changes in the value of the control signal CON are synchronized to the internal system clock signal ISCLK. The value of the control signal CON may increase in response to a positive (negative) up/down control signal UP/DN and may decrease in response to a negative (positive) up/down control signal UP/DN. The internal system clock signal ISCLK is generated by logically combining the periodic driving clock signal DCLK with an active low halt signal HALTB, using a gate 532 that performs a boolean AND operation. Thus, when the halt signal HALTB is inactive at a logic 1 level, then the internal system clock signal ISCLK will match the driving clock signal DCLK. However, when the halt signal HALTB is active at a logic 0 level, the driving clock signal DCLK will be blocked and the internal system clock signal ISCLK will be held (i.e., locked) at a logic 0 level. The DLL analog block 533 may comprise a conventional delay line having a variable length that is set by the value of the control signal CON or a fixed length. In the event the delay line has a fixed length, the control signal CON may set the value of the delay provided by each active delay element in the chain. This DLL analog block 533 is configured to generate the internal clock signal ICLK in response the primary clock signal CLK.

The abrupt jitter detection and blocking circuit 55 is configured to generate the halt signal HALTB at the active low level whenever an excessive phase difference is detected between the feedback clock signal FCLK and the primary clock signal CLK. This excessive phase difference may result from on-chip power supply noise that causes the feedback clock signal FCLK to incur a short duration phase transient or from variations in the phase of the primary clock signal CLK. The abrupt jitter detection and blocking circuit 55 includes a phase window detection circuit 551 and an abrupt jitter decision circuit 553. The phase window detection circuit 551 is more fully illustrated by FIG. 7 and the abrupt jitter decision circuit 553 is more fully illustrated by FIG. 8.

Figure 7:
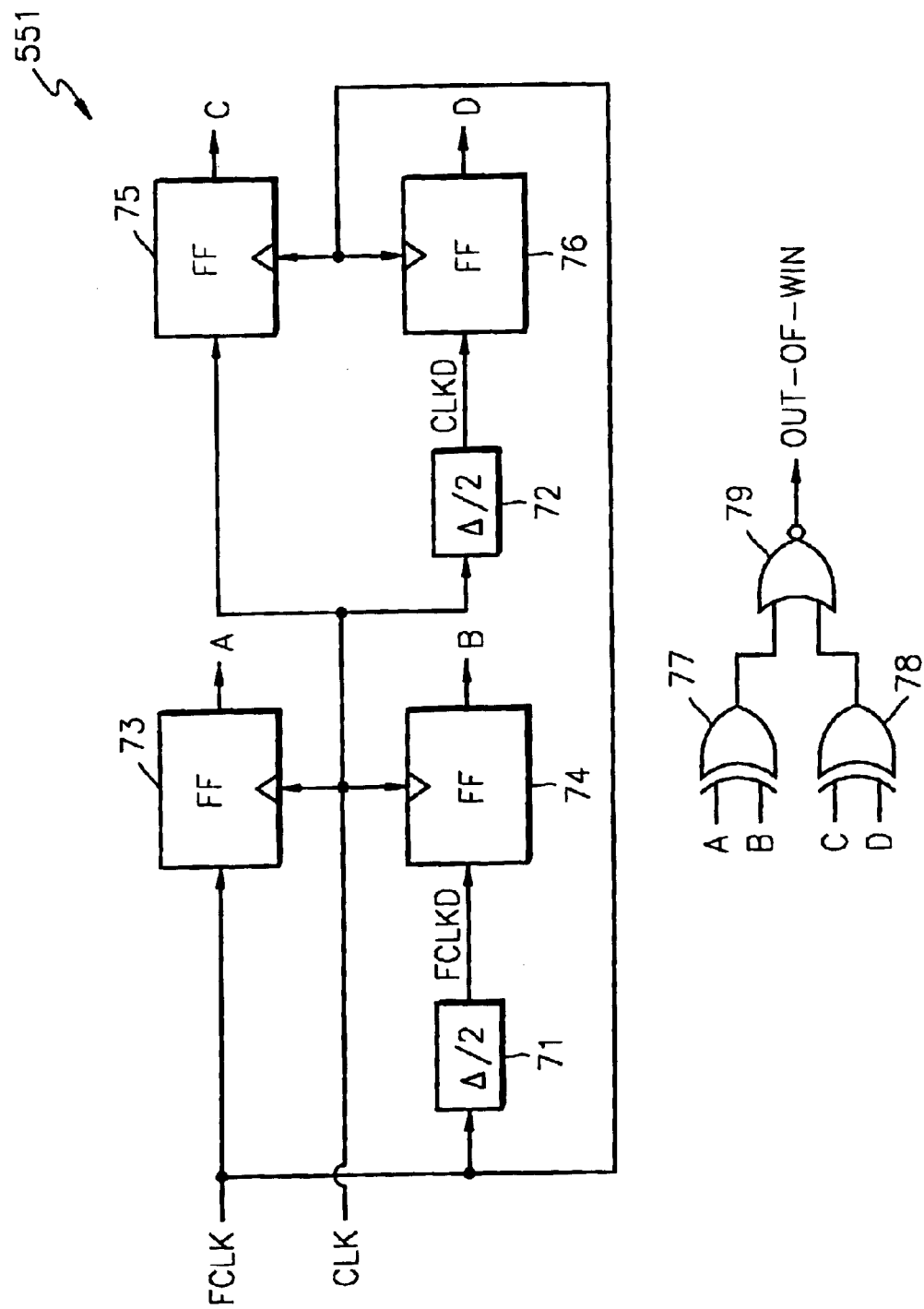
FIG. 7 is an electrical schematic of a phase window detection circuit according to an embodiment of the present invention.

Referring now to FIG. 7, the phase window detection circuit 551 is illustrated as including four D-type flip-flops 73–76, two delay elements 71–72, two XOR gates 77–78 and a NOR gate 79. The delay elements 71 and 72 are configured to provide a delay equal to ½Δ, where Δ represents the acceptable range in phase difference between the feedback clock signal FCLK and the primary clock signal CLK (i.e., Δ represents the maximum amount of time by which a leading edge of FCLK may lag a corresponding leading edge of CLK or vice versa). The flip-flop 73 is configured to receive the feedback clock signal FCLK and the flip-flop 74 is configured to receive a delayed feedback clock signal FCLKD, which is generated by delay element 71. The flip-flops 73 and 74 have clock inputs that are responsive to the primary clock signal CLK. The flip-flop 75 is configured to receive the primary clock signal CLK and the flip-flop 76 is configured to receive a delayed primary clock signal CLKD, which is generated by delay element 72. The flip-flops 75 and 76 have clock inputs that are responsive to the feedback clock signal FCLK.

The outputs A, B, C and D of the flip-flops 73–76 are provided to the inputs of the XOR gates 77 and 78. The output of the XOR gate 77 is set to a logic 1 level whenever inputs A and B differ in value and the output of XOR gate 78 is set to a logic 1 level whenever inputs C and D differ in value. The NOR gate 79 generates an active high out-of-window signal (OUT-OF-WIN) whenever both outputs of the XOR gates 77 and 78 are held at logic 0 levels. Thus, value of the out-of-window signal OUT-OF-WIN can be defined by the following boolean expression:

$$\text{OUT-OF-WIN} = \text{NOT}((A \oplus B) + (C \oplus D)) \quad (1)$$

Thus, based on the configuration of the phase window detection circuit 551, the out-of-window signal OUT-OF-WIN will be set to an active high level whenever the feedback clock signal FCLK and primary clock signal CLK are out of phase by an excessive amount. This excessive phase difference may be represented by the locking state and signal edge diagrams illustrated at the center of FIG. 4.

Figure 8:
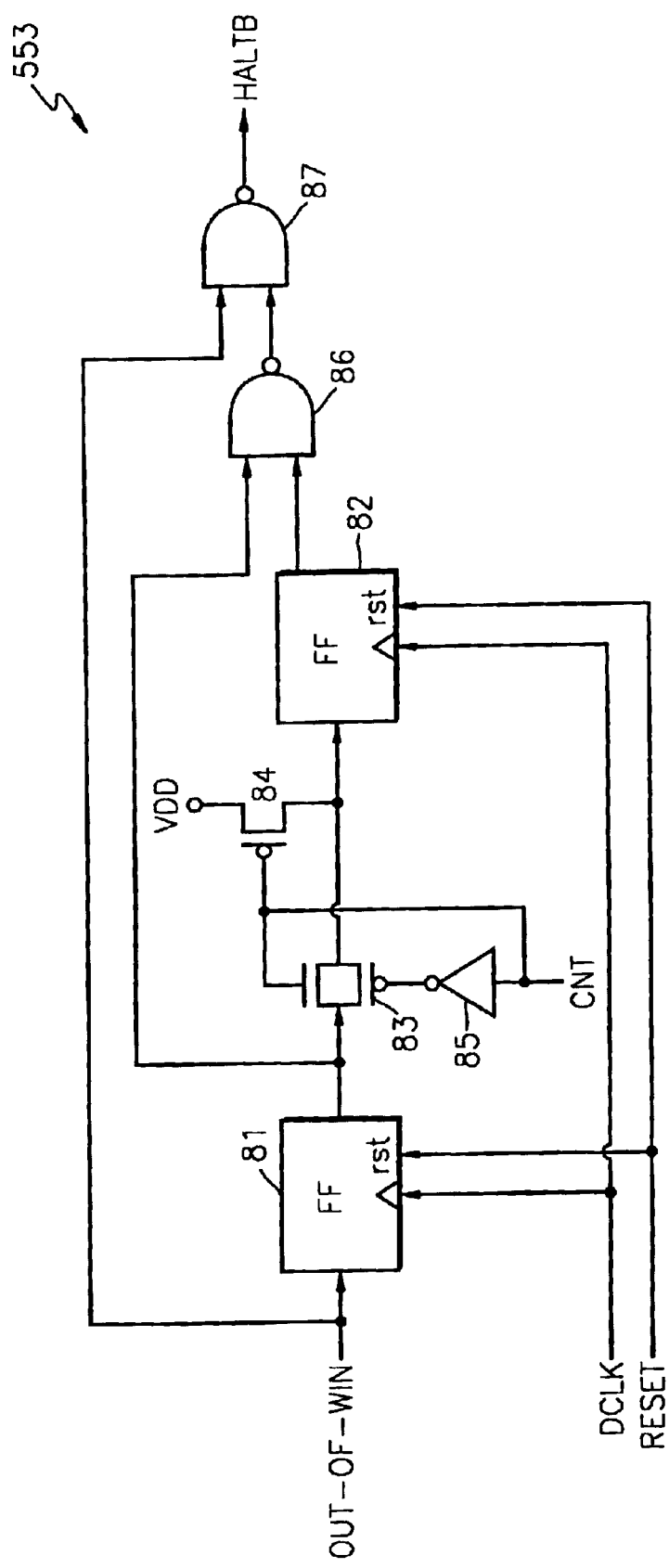
FIG. 8 is an electrical schematic of a abrupt jitter decision circuit according to an embodiment of the present invention.

In FIGS. 5A and 8, the abrupt jitter decision circuit 553 is illustrated as generating the halt signal HALTB in response to the out-of-window signal OUT-OF-WIN. The decision circuit 553 includes a pair of flip-flops (FF) 81 and 82 and pair of two-input NAND gates 86 and 87. Isolation circuitry is also provided between the flip-flops 81 and 82. This isolation circuitry is illustrated as including an inverter 85, a transmission gate 83 and a PMOS pull-up transistor 84. Each of these three elements is responsive to a control signal CNT. In some embodiments, the control signal CNT may be derived from a conventional MRS signal (command) in the event the DLL integrated circuit 50 is embodied in a SDRAM device, or derived from a fuse information signal. When the control signal CNT is set to a logic 1 level, the pass gate 83 is open and the PMOS pull-up transistor 84 is disabled. Accordingly, the data input of the second flip-flop 82 is electrically coupled to the data output of the first flip-flop 81. However, when the control signal CNT is set to a logic 0 level, then the pass gate 83 is closed and the PMOS pull-up transistor 84 is active. Under these conditions, the data input of the second flip-flop 82 is held at a high level and not influenced by changes in the output of the first flip-flop 81. Both flip-flops 81 and 82 have clock input terminals that are responsive to the driving clock signal DLCK. The flip-flops 81 and 82 are also configured to receive an active high reset signal (RESET).

The abrupt jitter decision circuit 553 of FIG. 8 is configured so that active out-of-window signals OUT-OF-WIN of relatively short duration are ignored as being representative of short duration transients between the phases of the clock signals FCLK and CLK. In contrast, active out-of-window signals OUT-OF-WIN of relatively long duration are treated as requiring a change in the delay provided by the DLL analog block 533. This change in the delay provided by the DLL analog block 533 will operate to adjust the phase of the internal clock signal ICLK and feedback clock signal FCLK so that renewed delay locking can be achieved by the DLL integrated circuit 50.

As will now be described more fully with reference to TABLES 1 and 2, the value of the control signal CNT will operate to set the duration of the period during which excessive phase jitter will be ignored (i.e., blocked from influencing the delay provided by the DLL analog block 533). In particular, TABLE 1 illustrates the state of the signals in FIG. 8 when the control signal CNT is set to a logic 1 level. The notation "REn", where n is a positive integer, indicates a rising edge of the driving clock signal DCLK. The notation "+" represents a time point just after a leading edge (e.g. rising edge) of the driving clock signal DCLK and the notation "−" represents a time point just before the leading edge of the driving clock signal DCLK.

TABLE 1 also illustrates the status of the DLL analog block 533 (delay line) when an active out-of-window signal OUT-OF-WIN is present. When the control signal CNT is set to a logic 1 level, changes in the state of the DLL analog block 533 will be blocked for two consecutive cycles of the driving clock signal DCLK (shown as UPDATE BLOCKED). However, if the out-of-window signal OUT-OF-WIN is active for a relatively long duration, then the abrupt jitter decision circuit 553 of FIG. 8 will not treat an excessive phase difference between the feedback clock signal FCLK and primary clock signal CLK as a mere short duration transient to be ignored. In this case, the delay provided by the DLL analog block 533 will, after two "blocking" cycles, be updated even if the out-of-window signal OUT-OF-WIN is active at a logic 1 level (i.e., OUT-OF-WIN=HIGH).

TABLE 1

| DCLK | RE1+ | RE2+ | RE3− | RE3+ | RE4+ | RE5+ | RE6− | RE6+ |
|---|---|---|---|---|---|---|---|---|
| OUT-OF-WIN | LOW | LOW | LOW–HIGH | HIGH | HIGH | HIGH | HIGH–LOW | LOW |
| RESET | LOW | LOW | LOW | LOW | LOW | LOW | LOW | LOW |
| FF 81 OUT | LOW | LOW | LOW | LOW–HIGH | HIGH | HIGH | HIGH | HIGH–LOW |
| FF 82 OUT | LOW | LOW | LOW | LOW | LOW–HIGH | HIGH | HIGH | HIGH |
| NAND 86 OUT | HIGH | HIGH | HIGH | HIGH | HIGH–LOW | LOW | LOW | LOW–HIGH |
| HALTB | HIGH | HIGH | HIGH–LOW | LOW | LOW–HIGH | HIGH | HIGH | HIGH |
| DELAY LINE STATUS | UPDATE ENABLED | UPDATE ENABLED | UPDATE ENABLED | UPDATE BLOCKED | UPDATE BLOCKED | UPDATE ENABLED | UPDATE ENABLED | UPDATE ENABLED |
| CNT | HIGH | HIGH | HIGH | HIGH | HIGH | HIGH | HIGH | HIGH |

In contrast, as illustrated by TABLE 2, when the control signal CNT is set to a logic 0 level, updates to the state of the DLL analog block 533 will be blocked for only one cycle of the driving clock signal DCLK. In this manner, setting the control signal CNT to a logic 0 level will operate to make the DLL integrated circuit 50 more robust in correcting phase differences between the feedback clock signal FCLK and the primary clock signal CLK. Yet, in noisy environments where excessive jitter may be present more frequently, setting the control signal CNT to a logic 1 level will inhibit the DLL integrated circuit 50 from making unnecessary corrections to the phases of the internal and feedback clock signals.

TABLE 2

| DCLK | RE1+ | RE2+ | RE3− | RE3+ | RE4+ | RE5+ | RE6− | RE6+ |
|---|---|---|---|---|---|---|---|---|
| OUT-OF-WIN | LOW | LOW | LOW–HIGH | HIGH | HIGH | HIGH | HIGH–LOW | LOW |
| RESET | LOW | LOW | LOW | LOW | LOW | LOW | LOW | LOW |
| FF 81 OUT | LOW | LOW | LOW | LOW–HIGH | HIGH | HIGH | HIGH | HIGH–LOW |
| FF 82 OUT | HIGH | HIGH | HIGH | HIGH | HIGH | HIGH | HIGH | HIGH |
| NAND 86 OUT | HIGH | HIGH | HIGH | HIGH–LOW | LOW | LOW | LOW | LOW–HIGH |
| HALTB | HIGH | HIGH | HIGH–LOW | LOW–HIGH | HIGH | HIGH | HIGH | HIGH |

TABLE 2-continued

Figure 6:
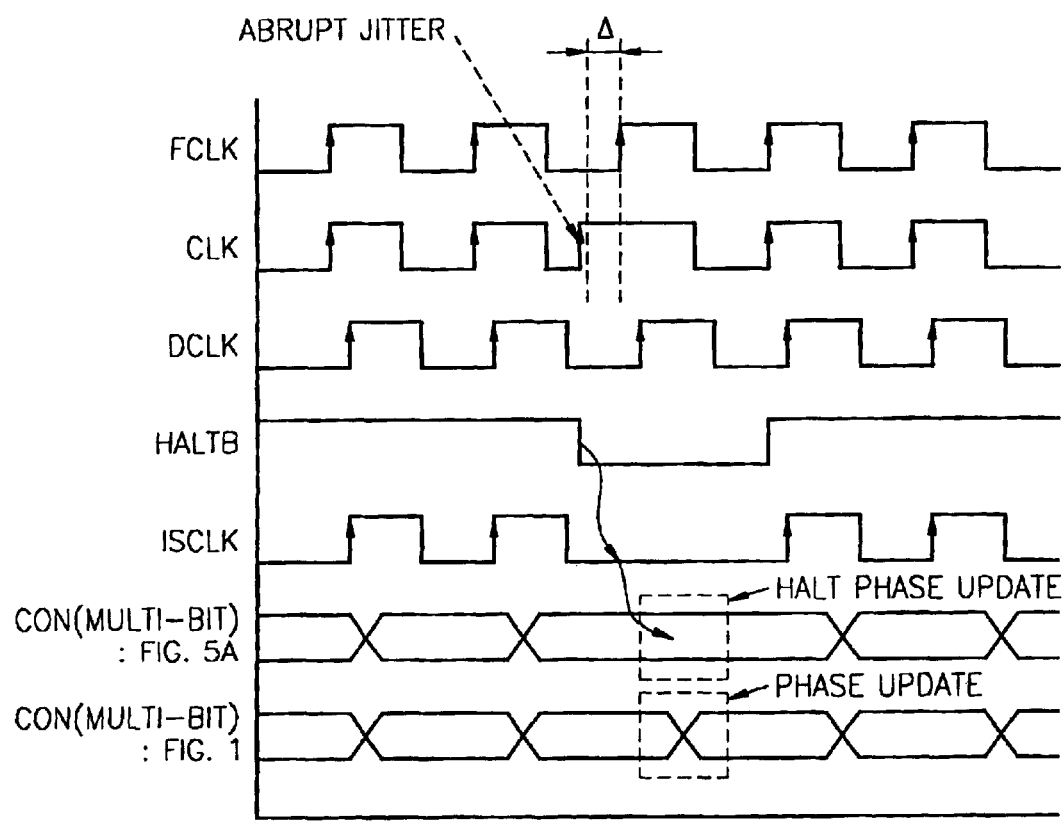
FIG. 6 is a timing diagram that illustrates a comparison between the operation of the DLL integrated circuit of FIG. 1 and the operation of the DLL integrated circuit of FIG. 5A, in response to excessive phase jitter.

| DCLK | RE1+ | RE2+ | RE3− | RE3+ | RE4+ | RE5+ | RE6− | RE6+ |
|---|---|---|---|---|---|---|---|---|
| DELAY LINE STATUS CNT | UPDATE ENABLED LOW | UPDATE ENABLED LOW | UPDATE ENABLED LOW | UPDATE BLOCKED LOW | UPDATE ENABLED LOW | UPDATE ENABLED LOW | UPDATE ENABLED LOW | UPDATE ENABLED LOW | some of the timing events illustrated by TABLE 2 are also illustrated by the timing diagram of FIG. 6. In particular, FIG. 6 illustrates the occurrence of excessive jitter between the clock signal CLK and feedback clock signal FCLK. In response to this excessive jitter, the halt signal HALTB is switched to an active low level and the periodic nature of the internal system clock signal ISCLK is interrupted (ISCLK=HALTB×DCLK). In response to the interruption of ISCLK, the phase update that occurs in response to a change in the control signal CON is temporarily blocked. This contrasts with the timing of the control signal CON that would be present in the DLL integrated circuit 10 of FIG. 1, where no blocking is present.

The DLL integrated circuit 50 of FIG. 5A may also be employed in an embodiment that generates a percent-of-clock delay to a periodic signal. For example, FIG. 5B illustrates a DLL integrated circuit 50' that includes an internal clock generating circuit 53' and a slave delay line 59. The internal clock generating circuit 53' includes a master delay line 533' and a DLL control block 531'. In the event the percent-of-clock delay is 20%, the ratio of the number of delay elements within the slave delay line 59 to the number of delay elements within the master delay line 533' may equal 0.2. The slave delay line 59 generates an output signal OUT that is delayed by 0.2 T relative to a periodic input signal IN, where "T" represents a period of the primary clock signal CLK. In some embodiments, the input signal IN may be the primary clock signal CLK.

The DLL control block 531' operates to halt (i.e., block) at least one periodic update to the master and slave control signals CON1 and CON2 when the out-of-window signal OUT-OF-WIN is active at a high level. Here, the master delay line 533' and the slave delay line 59 may have fixed length and the control signals CON1 and CON2 may operate to set the delay of the delay elements in the fixed length delay lines. The operation of the DLL integrated circuit 50' is otherwise similar to the DLL integrated circuit 50 of FIG. 5A. Furthermore, the phase detector 51, the abrupt jitter detection and blocking circuit 55 and the DLL control block 531' collectively form a DLL control circuit 54' that is configured to perform the operations of these elements of the DLL integrated circuit 50'.

Still further embodiments of the present invention may include phase locked loops (PLLs) having control circuits therein that detect excessive phase jitter and operate to halt a voltage-controlled oscillator (VCO) therein for a predetermined period of time once the excessive phase jitter is detected. Additional information relating to PLLs can be found in at section 9.5.2 of a textbook by J. Rabaey, entitled "Digital Integrated Circuits: A Design Perspective," Prentice-Hall, Inc., (1996), pp. 540–543, the disclosure of which is hereby incorporated herein by reference.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. An integrated circuit device, comprising:
at least one delay element; and
a control circuit that is configured to periodically adjust a delay of said at least one delay element in response to a first clock signal and is further configured to block at least one periodic adjustment of the delay of the at least one delay element in response to detecting an excessive jitter of the first clock signal, said control circuit comprising:
a phase detector that is configured to generate an up/down control signal in response to a feedback clock signal and the first clock signal;
a phase window detection circuit that is configured to generate an active out-of-window signal in response to detecting an excessive phase difference between the feedback clock signal and the first clock signal; and
an abrupt jitter decision circuit that is configured to generate an active halt signal in response to the active out-of-window signal. said abrupt jitter decision circuit comprising a first flip-flop having an input electrically coupled to an output of said chase window detection circuit, a second flip-flop, and an isolation circuit electrically coupled between an output of said first flip-flop and an input of said second flip-flop.

2. The device of claim 1, wherein said at least one delay element and said control circuit collectively define a percent-of-clock delay circuit; and wherein said at least one delay element has an input that receives the first clock signal.

3. The delay circuit of claim 1, wherein said isolation circuit is responsive to a control signal selected from the group consisting of an MRS command signal and a fuse information signal.

4. The delay circuit of claim 3, wherein said isolation circuit is configured so that a value of the control signal sets a length of a blocking period during which the delay of the at least one delay element is not adjusted.

5. A delay locked loop (DLL) integrated circuit device, comprising:
a delay line that is configured to generate an internal clock signal in response to a primary clock signal received at an input thereof, said delay line responsive to a control signal having a value that establishes an amount of delay provided by said delay line; and
a control circuit that is configured to generate the control signal in response to the primary clock signal and a feedback clock signal derived from the internal clock signal, said control circuit configured to block at least one periodic adjustment to the value of the control signal and the delay provided by said delay line in response to detecting an excessive phase difference between the primary clock signal and the feedback clock signal.

6. An integrated circuit device, comprising:
a delay locked loop (DLL) that is configured to generate an outgoing clock signal in response to a primary clock signal, said DLL comprising:

a phase detector that is configured to compare a phase of the primary clock signal with a phase of a feedback clock signal that is derived from the outgoing clock signal;

a variable delay element that is configured to generate the outgoing clock signal in response to at least a first time-varying control signal and the primary clock signal; and means, responsive to the primary clock signal and the feedback clock signal, for generating an active halt signal that blocks at least one periodic update of a delay provided by said variable delay element in response to detecting an excessive phase difference between the primary and feedback clock signals.

7. A delay locked loop integrated circuit device, comprising:

a delay line that is configured to generate a second clock signal in response to at least a first time-varying control signal and a first clock signal; and means, responsive to the first clock signal and a third clock signal derived from the second clock signal, for at least temporarily blocking a change in the first time-varying control signal and a delay provided by said delay line in response to detecting an excessive phase difference between the first and third clock signals.

8. A delay locked loop integrated circuit, comprising:

a master delay line that is configured to delay a primary clock signal received at an input thereof by an amount specified by a time-varying control signal; and a control circuit that is configured to generate the time-varying control signal when excessive phase jitter is not present in the primary clock signal and is further configured to at least temporarily block changes in a value of the time-varying control signal and a delay provided by said master delay line in response to detecting excessive phase jitter in the primary clock signal.

9. A method of operating a delay locked loop (DLL) integrated circuit, comprising the step of:

blocking a periodic update of a delay provided by a delay line that is configured to receive a primary clock signal, in response to detecting an excessive phase jitter with the primary clock signal.

10. The method of claim 9, wherein the periodic update of the delay is synchronized with a driving clock signal having a period equivalent to a period of the primary clock signal.

11. The method of claim 10, wherein said blocking step is followed by the step of resuming periodic updates of the delay provided by the delay line in the presence of excessive phase jitter with the primary clock signal.

12. The method of claim 11, wherein said blocking step is performed in response to generating an active halt signal; and wherein said step of resuming periodic updates is performed in response to generating an inactive halt signal.

13. The method of claim 9, wherein said blocking step is followed by the step of resuming periodic updates of the delay provided by the delay line in the presence of excessive phase jitter with the primary clock signal.

14. The method of claim 13, wherein said blocking step is performed in response to generating an active halt signal; and wherein said step of resuming periodic updates is performed in response to generating an inactive halt signal.

15. The method of claim 9, wherein said blocking step preceded by the steps of:

generating an active out of window signal in response to detecting an excessive phase difference between the primary clock signal and a feedback clock signal; and generating, in response to the active out of window signal, an active halt signal that is synchronized with a driving clock signal that is derived from the primary clock signal.

16. The method of claim 15, wherein said blocking step is followed by the step of resuming periodic updates of the delay provided by the delay line in the presence of excessive phase jitter with the primary clock signal.

17. The method of claim 16, wherein said blocking step is performed in response to generating an active halt signal; and wherein said step of resuming periodic updates is performed in response to generating an inactive halt signal while the out of window signal remains active.

* * * * *